United States Patent
Cheon

(10) Patent No.: US 7,824,585 B2
(45) Date of Patent: Nov. 2, 2010

(54) APPARATUS AND METHOD FOR FABRICATING SEMICONDUCTOR PACKAGES

(75) Inventor: Seung-Jin Cheon, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 533 days.

(21) Appl. No.: 11/882,970

(22) Filed: Aug. 8, 2007

(65) Prior Publication Data

US 2008/0038848 A1 Feb. 14, 2008

(30) Foreign Application Priority Data

Aug. 8, 2006 (KR) .................. 10-2006-0074922

(51) Int. Cl.
*H01L 21/56* (2006.01)
(52) U.S. Cl. ................ 264/40.5; 264/272.17; 425/127; 425/135; 425/141
(58) Field of Classification Search ................ 425/127, 425/135, 141; 264/40.5, 272, 17
See application file for complete search history.

(56) References Cited

U.S. PATENT DOCUMENTS 6,014,886 A * 1/2000 Anderson et al. ............ 73/1.81

2002/0072134 A1* 6/2002 Ha et al. ....................... 438/14
2005/0070047 A1* 3/2005 Kuratomi et al. ............ 438/107
2006/0093692 A1 5/2006 Miyajima et al.

FOREIGN PATENT DOCUMENTS

| JP | 08-316258 | 11/1996 |
| JP | 11-126786 | 5/1999 |
| JP | 2005-101407 | 4/2005 |
| KR | 100457420 B1 | 11/2004 |
| KR | 10-2006-0052406 A | 5/2006 |

* cited by examiner

Primary Examiner—Robert B Davis
(74) Attorney, Agent, or Firm—Harness, Dickey & Pierce, P.L.C.

(57) ABSTRACT

An apparatus for fabricating semiconductor packages may include a thickness measurer configured to measure the thickness of a printed circuit board (PCB); mold dies, clamped to the top and the bottom of the PCB, through which a molding compound may be injected; and a pressure controller configured to control a clamp pressure of the mold die in response to the thickness of the PCB. The thickness of the PCB may be measured before molding the PCB, and a clamp pressure corresponding to the measured thickness may be decided. Therefore, it is possible to adjust the thickness variation of a PCB in real time, as they are being produced, to decrease the number of bad packages.

17 Claims, 7 Drawing Sheets

APPARATUS AND METHOD FOR FABRICATING SEMICONDUCTOR PACKAGES

PRIORITY STATEMENT

This application claims priority under 35 U.S.C §119 to Korean Patent Application No. 2006-74922, filed on Aug. 8, 2006, in the Korean Patent Office, the entire contents of which are incorporated by reference.

BACKGROUND

Example embodiments relate to apparatuses and methods for fabricating semiconductor devices. More specifically, example embodiments are directed to apparatus and method for fabricating semiconductor packages.

Semiconductor chips fabricated on a wafer are packaged to be assembled. With the recent trend toward smaller and lighter products, various types of packages have been developed to reduce packaging area and thickness.

One state-of-the-art package is a ball grid array (BGA) where balls are arranged underneath one package. The BGA is advantageous in reducing a package area and exhibits improved electric characteristics. A plastic BGA (PBGA) may use a printed circuit board (PCB) including multi-layer wirings capped to a photo solder resist (PSR) to increase data transmission speed and/or bandwidth.

FIG. 1 illustrates a conventional printed circuit board (PCB) 10 for a plastic ball grid array (PBGA). The PCB 10 may include a board body 5 and multi-layer wirings 12a and 12b disposed at a first surface 8a and a second surface 8b, respectively, of the board body 5. A chip area (not shown) and a bonding area 18 may be formed in the first surface 8a, and a buffer area 20 may be formed in the second surface 8b. Semiconductor chips 11 may be situated in the chip area, and solder balls may be disposed at the buffer area 20. The bonding area 18 may be formed to bond the semiconductor chip 11 with the first wiring 12a. The first wiring 12a and the second wiring 12b may be electrically connected by a via pattern 6 penetrating the board body 5.

The first surface 8a and second surface 8b of the PCB 10 may be covered with photo solder resist (PSR) layers 14a and 14b. The first wirings 12a and second wirings 12b may be made of copper foil to control their thicknesses, while coating thicknesses of the PSR layers 14a and 14b may be controlled less accurately.

FIG. 2 illustrates a conventional mold die for use in fabrication of semiconductor packages. The mold die may be divided into a top unit 50t and a bottom unit 50b. The top unit 50t may include a master top die 52t, a top spacer block 54t, and/or a top mold 56t. The bottom unit 50b may include a master bottom die 52b, a bottom spacer block 54b, and a bottom mold 56b. The master bottom die 52t and the master bottom die 52b may apply a clamp pressure to the top mold 56t and the bottom mold 56b, pressing a PCB 10 placed between the top and bottom molds 56t and 56b to close a cavity 60 into which a mold resin may be injected.

The top mold 56t have formed cavities 60, a cull area 68 where a molding resin 64 may be fluidized, or partially fluidized, by the force of a press arm 66, and a runner 62 along which the fluidized molding resin 64 may be allowed to flow into the cavity 60.

When the top unit 50t and the bottom unit 50b are clamped with a predetermined or given pressure, a suitable pressure may be applied to the PCB 10. However, improper clamping of the top and bottom units 50t and 51b may cause the problems shown in FIGS. 3 and 4.

As previously stated, a printed circuit board (PCB) 10 may have a thickness tolerance resulting from non-uniform coating of a photo solder resist (PSR) 65. If a PCB 10 requires a small thickness, the cavity 60 may not become fully sealed with the top surface of the PCB 10 while it is being molded by a preset clamp pressure of a mold die. For this reason, a molding resin 69 may be effused such that the resin covers a package cutting line 67. Subsequently, a package may not be separated from the PCB as shown in FIG. 3, or a cutter may be damaged as shown in FIG. 4.

In the case where the thickness of a PCB exceeds an allowable range, if a strong clamp pressure is applied to the PCB, a first wiring 12a connected to a via pattern 16 may be cut or damaged 70, as shown in FIG. 4. When the first wiring 12a is cut or damaged 70, a signal may not be transmitted to a semiconductor chip in a package. Accordingly, the package may not be used usable.

Conventionally, the spacer block 54t may be polished to control a pressure applied to a PCB. However, the thickness of a spacer block is conventionally computed by running repeated tests conducted after the fabrication of a bad package, and time is required for replacing or polishing the spacer block. Moreover, this approach cannot cope with thickness variation of all PCBs.

SUMMARY

Example embodiments are directed to an apparatus and method for fabricating semiconductor packages. In an example embodiment, the apparatus may include: a thickness measurer configured to measure the thickness of a printed circuit board (PCB); mold dies, clamped to the PCB, through which a molding compound may be injected; and a pressure controller configured to control a clamp pressure of the mold die in response to the thickness of the PCB. Example embodiments may take continuous and/or real-time PCB thickness measurements in order to automatically and/or quickly adjust and control the mold die clamp pressure associated with PCB manufacturing, such that the thickness of the PCB may be inexpensively and/or quickly corrected.

In another example embodiment, the method may include: measuring the thickness of a printed circuit board (PCB); calculating a clamp pressure corresponding to the measured thickness; and clamping mold dies to two surfaces of the PCB using the calculated clamp pressure.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
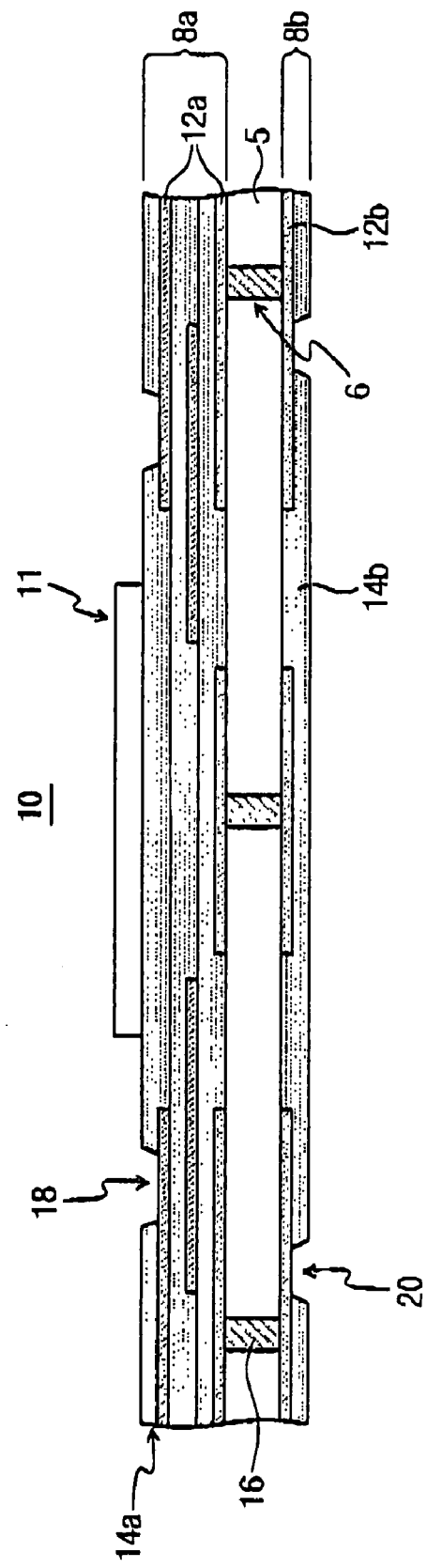
FIG. 1 is a cross-sectional view of a conventional printed circuit board (PCB) for a semiconductor package.
Figure 2:
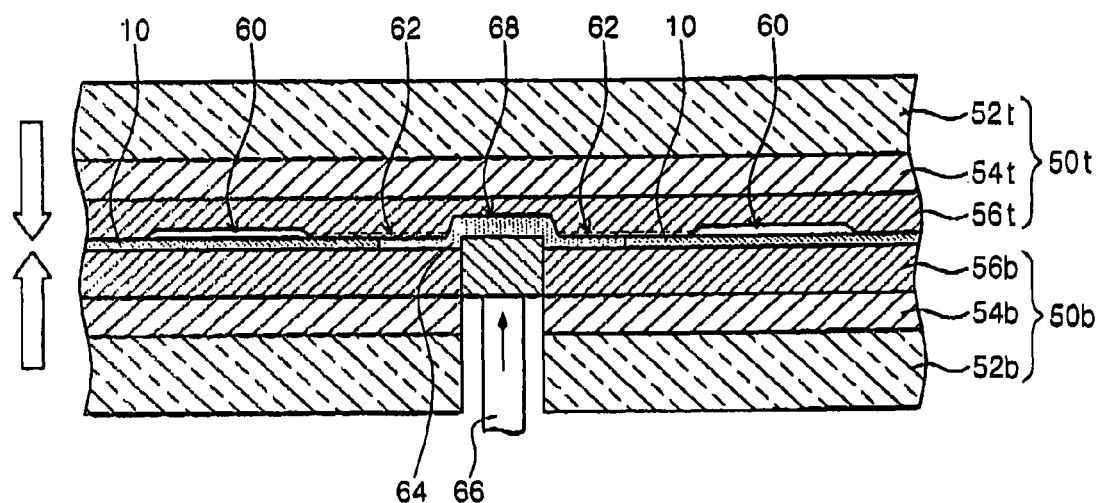
FIG. 2 illustrates a conventional method for fabricating semiconductor packages.
Figure 3:
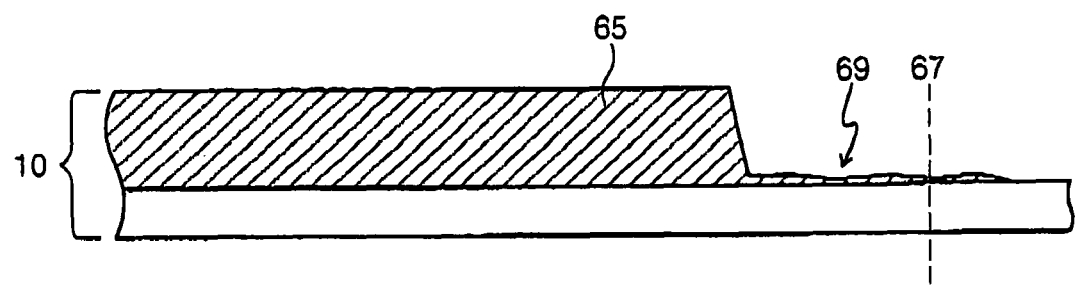
FIGS. 3 and 4 illustrate conventional problems arising from a bad package, respectively.
Figure 4:
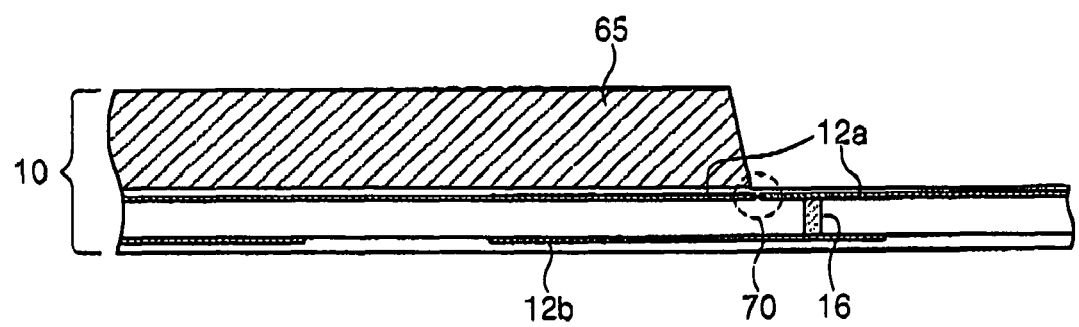

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments will now be described more fully hereinafter with reference to the accompanying drawings. Example embodiments, however, may be embodied in many different forms and should not be construed as limited to the embodiments set forth herein. Rather, these embodiments are provided so that this disclosure may be thorough and complete, and may fully convey the scope of the embodiment to those skilled in the art. Like numbers refer to like elements throughout.

Figure 5:
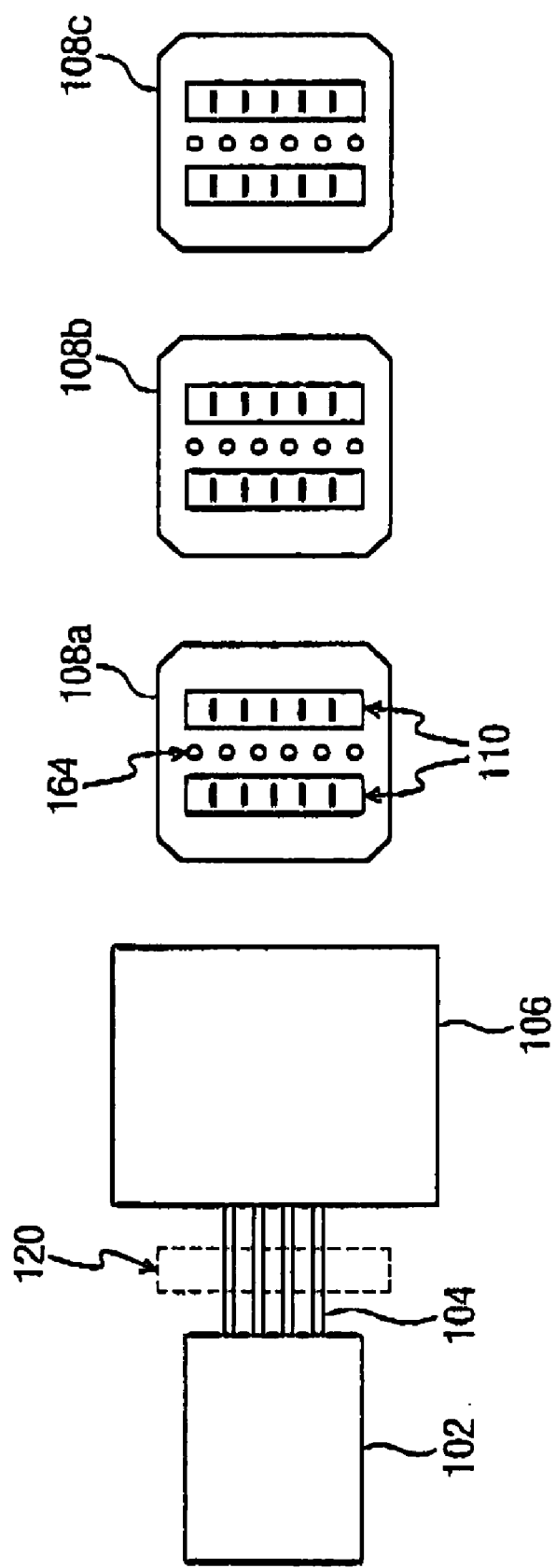
FIG. 5 illustrates an apparatus for fabricating semiconductor packages according to an example embodiment.

FIG. 5 illustrates an apparatus for fabricating semiconductor packages according to an example embodiment. The apparatus may include a library 102 in or on which a plurality of printed circuit boards (PCBs) may be loaded or housed, a loader 104 configured to transport the PCBs to an aligner 106 from the library 102, and mold dies 108*a*, 108*b*, and 108*c* where a printed circuit board (PCB) 110 and a molding resin 164 may be disposed to mold the PCB 110. The aligner 106 aligns the PCBs 110 before the PCBs 110 are transported to the mold dies (108*a*, 108*b* and 108*c*).

The library 102 may include a plurality of slots where PCBs may be placed such that semiconductor chips may be bonded, for example, by wire bonding or bumpers. The PCBs may be sequentially transported from the library 102 to the aligner 106 along the loader 104. In an example embodiment, a thickness measurer 120 may be located at the loader 104 to measure the thickness of the PCBs. Alternatively, the thickness measurer 120 may be located elsewhere, such that it is not constrained to be located near the loader 104, but rather it can be located in another position that allows for the thickness measurements to be taken in order to adjust the clamp pressure.

The PCBs transported to the aligner 106 may be aligned with x-axis and y-axis, together with a molding resin. The aligned PCB 110 and molding resin 164 may be transported to mold dies 108*a*, 108*b*, and 108*c* to be packaged.

Figure 6:
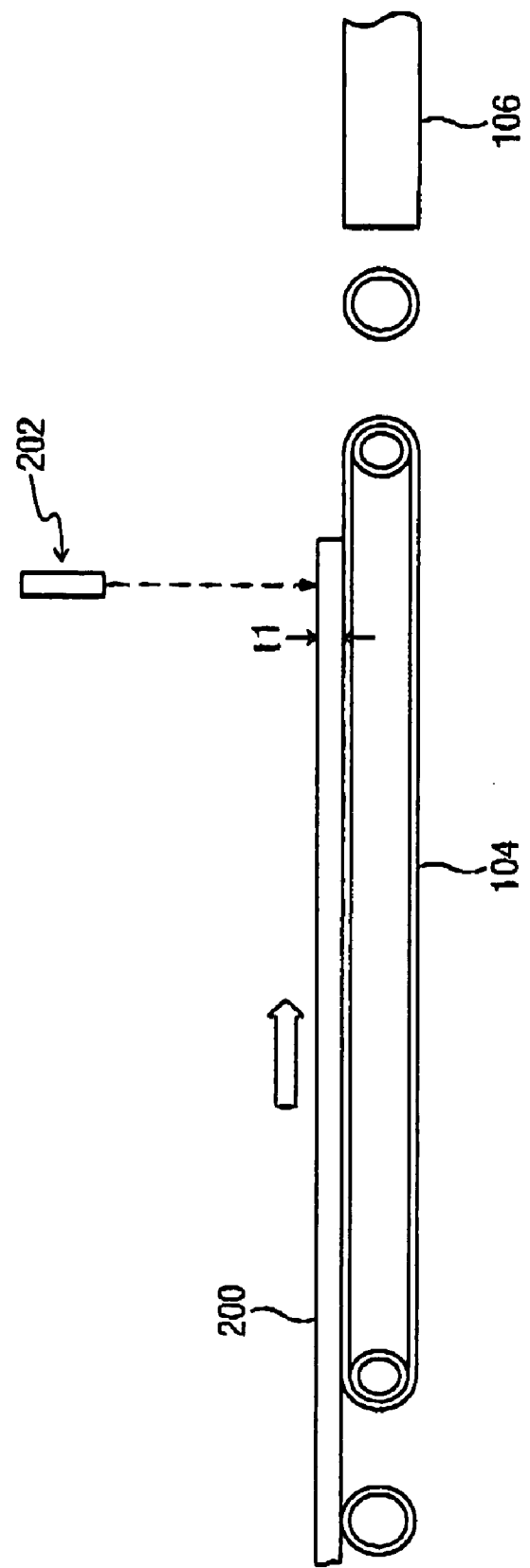
FIGS. 6 and 7 illustrate measurers for measuring a thickness of a printed circuit board (PCB) according to an example embodiment.

FIG. 6 illustrates a thickness measurer 202 according to an example embodiment. The thickness measurer 202 may be provided near a printed circuit board (PCB) 200 transported by a loader rail 104, conveyor belt, or other mechanism to move the PCB 200. The thickness measurer 202 may be a laser distance meter, which may irradiate a laser beam to the PCB 200 and analyze the signal of a reflected light to measure a distance. As illustrated, the laser distance meter 202 may be provided near the PCB 200 to measure a vertically impinging and reflected light. The thickness measurer 202 may include a light emitting device (not shown) configured to irradiate a laser beam to the PCB 200 and a photodetector (not shown) configured to detect the laser beam transmitted at a predetermined or desired reflection angle, which may be used to scan the morphology of the PCB surface in order to measure thickness.

The PCB 200 may be a pre-molded PCB to which a semiconductor chip may be bonded. Accordingly, the thickness of the PCB 200 may be obtained by a high-speed measurement for a region in the vicinity of the chip area on which the semiconductor chip may be disposed.

The PCB 200 may be able to move relative to the laser distance meter 202, and while the PCB 200 moves, the laser distance meter 202 may scan the PCB 200 to measure a thickness t1. Similar to the case of a conventional apparatus for fabricating semiconductor packages, the PCB 200 may be moved by a series of loading operations such as a conveyor belt or other mechanism for moving or sliding or shifting the PCB 200, and meanwhile the laser distance meter 202 may scan the PCB 200 simultaneously with the movement of the PCB 200. Thus, the thickness t1 may be measured within the same time period as required in the conventional manufacturing of PCB's, without special thickness measuring operations that may take added time or require additional steps and/or labor.

Figure 7:
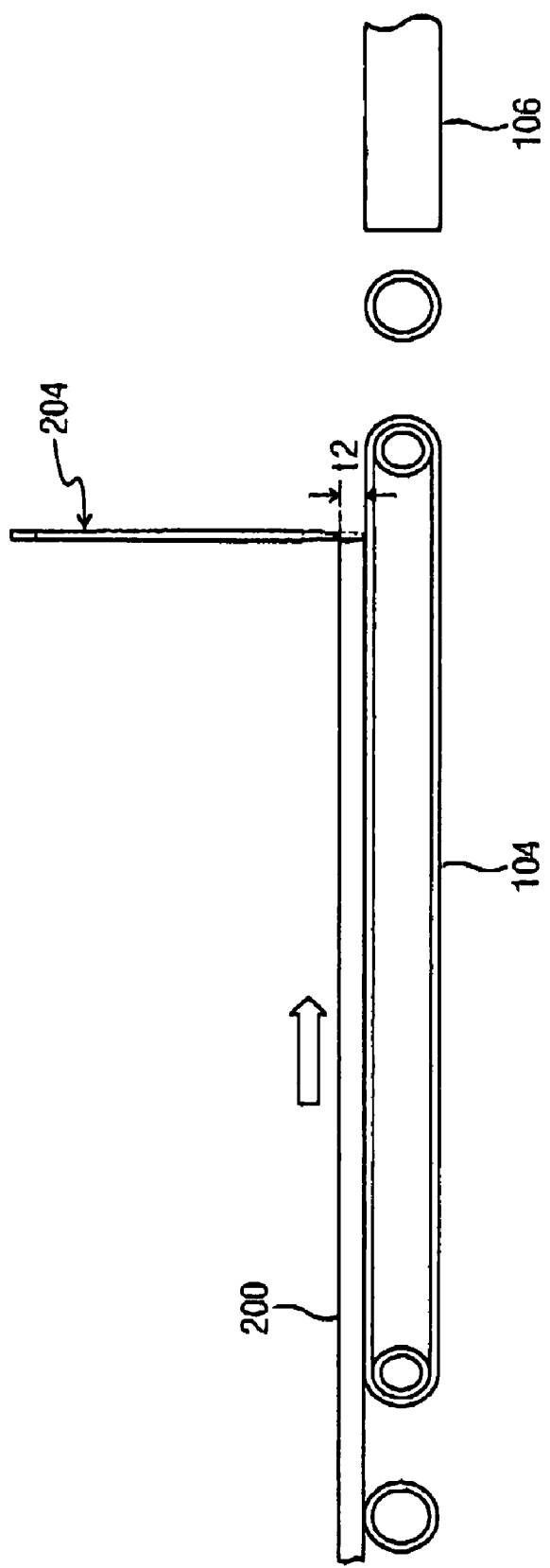

FIG. 7 illustrates a thickness measurer according to another example embodiment. In example embodiments, a thickness measurer of the PCB 200 may include a vertically shifting pin 204. The pin 204 may be pre-adjusted to a predetermined or desired vertical height. When the PCB 200 moves along the loader 104 to come in contact with the pin 204, the pin 204 may contact the top surface of the PCB 200 such that the pin may be vertically shifted and/or elevated. A thickness t2 of the PCB 200 may therefore be measured by pin 204, by measuring elevation changes of the pin 204 as the pin 204 contacts the upper surface of the PCB 200.

Similar to the case of the laser distance meter 202 illustrated in FIG. 6, the thickness t2 in FIG. 7 may be measured by scanning the top of the PCB 200 while it moves, relative to the position of the pin 204. The pin 204 may be vertically shifted up and down to track the morphology of the PCB 200, and may therefore measure the thickness t2.

A measuring device (not shown) may be provided for detecting the vertical shifting of the pin 204, to measure the vertical shift distance, to provide an accurate measurement of thickness. The pin 204 may be connected to the measuring device.

As described above, an apparatus with a thickness measurer may control a clamp pressure, in response to the thickness of a PCB.

Figure 8:
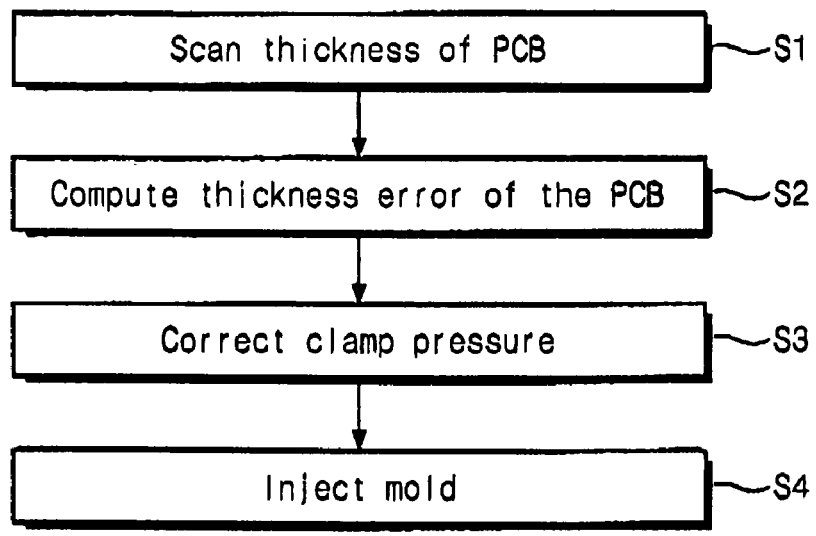
FIG. 8 is a flowchart illustrating a method for fabricating semiconductor packages according to an example embodiment.

FIG. 8 is a flowchart illustrating a method of fabricating semiconductor packages. A thickness of a printed circuit board (PCB) may be scanned, in order to be measured (S1). As previously described with reference to FIGS. 5 through 7, the thickness of the PCB may be measured by an optical or mechanical thickness measuring device. An error correction efficiency may be enhanced by scanning the PCB, rather than by selecting a portion of the PCB at random, or otherwise spot-checking for PCB thickness. The scanning of the PCB may be continuous and/or real-time scanning, such that thickness measurements are constantly being taken in order to adjust clamp pressure.

After measuring the thickness of the PCB, an error of the thickness may be computed (S2). A clamp pressure of a mold die may then be corrected (S3), and that clamp pressure may cause a portion of the molding resin to fluidize and be injected into the mold (S4). An allowable thickness range and a reference clamp pressure of a PCB may be set or preset, such that an error may then be calculated between the thickness allowable range and the measured thickness. For example, a molded state may be tested by measuring thicknesses of PCBs and changing a clamp pressure to create a correlation between the thickness of a PCB and a pressure applied to the PCB. From the pressure versus thickness correlation data, a thickness allowable range and a reference clamp pressure may be determined and an error exceeding the thickness allowable range may be computed to correct and/or adjust the clamp pressure. In other words, this error may be used to readjust the pressure that the mold dies place on the PCB.

In an alternative method, data relating to clamp pressure corresponding to the thickness of a PCB may be set or preset without setting a reference clamp pressure, directly. Using the thickness-pressure correlation, appropriate clamp pressure relating to the desired thickness of the PCB, may be applied to the mold die. An average thickness measurement of the PCB may be computed and applied to the thickness-pressure correlation. As a result, a pressure within an allowable range may be applied to the entire PCB to prevent problems such as pressing of a photo solder resist (PSR) or effusion of a molding resin.

Figure 9:
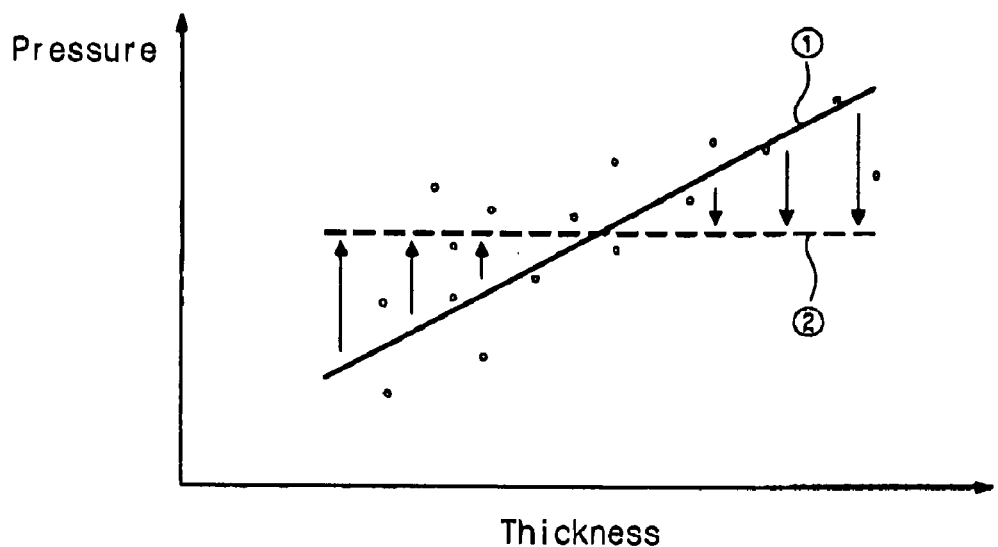
FIG. 9 is an example graph illustrating the correction of a clamp pressure during resin injection.

FIG. 9 is a graph illustrating an example inverse correlation of mold die pressure as a function of PCB thickness. In the graph, a line ① denotes a pressure applied to a PCB when a clamp pressure may be equivalently applied thereto, and ② denotes a pressure applied to the PCB when a clamp pressure may be corrected according to a measurement of PCB thickness.

Referring to FIG. 9, a pressure applied to a PCB increases with the increase in thickness of the PCB. Conventionally, an applied pressure may exceed an allowable range causing effusion of the molding resin, or a PSR may be pressed such that wiring may be inadvertently cut. However, in example embodiments, a clamp pressure may be adjusted to be proportional to the thickness. Thus, a correction value of the pressure to thickness variation may be used to apply a uniform or more uniform pressure to a PCB despite thickness variations. In this sense, the pressure controller may use PCB thickness measurements to compute an average thickness of the PCB, and then use the pressure versus thickness correlation data as depicted in FIG. 9 to calculate a clamp pressure for the mold die.

According to an example embodiment, a clamp pressure may be corrected by measuring the thickness of a printed circuit board (PCB) to reduce or prevent the breakage of a package wiring or the effusion of a molding resin during the fabrication of a semiconductor package. When the molding resin is not effused, the package may be readily separated from the PCB. During the transportation of the PCB, the thickness of the PCB may be measured to decide a clamp pressure. Thus, real-time feedback of the clamp pressure may be achieved, without additional time being added to PCB production.

Although example embodiments have been described in connection with accompanying drawings, it is not limited thereto. It will be apparent to those skilled in the art that various substitutions, modifications and changes may be made without departing from the scope and spirit of these example embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An apparatus for fabricating semiconductor packages, comprising:
    mold dies clamped to two surfaces of a printed circuit board (PCB), to form a cavity around said PCB;
    a thickness measurer configured to measure the thickness of said PCB; and
    a pressure controller configured to control a clamp pressure of said mold dies in response to said thickness measurer, said clamp pressure causing a portion of a molding resin to fluidize and fill said cavity,
    wherein the thickness measurer is configured to scan the PCB to measure the thickness of the PCB during movement of the PCB into the mold dies.

2. The apparatus as set forth in claim 1, wherein the thickness measurer scans the PCB continuously, in order to measure the thickness in real-time.

3. The apparatus as set forth in claim 1, wherein the thickness measurer is an optical measuring device.

4. The apparatus as set forth in claim 3, wherein the optical measuring device is a laser distance meter.

5. The apparatus as set forth in claim 1, wherein the thickness measurer is a mechanical measuring device.

6. The apparatus as set forth in claim 5, wherein the mechanical measuring device comprises:
  a vertically shifting pin responsive to the morphology of a surface of said PCB; and
  a measuring device for measuring an elevation change associated with said vertically shifting pin.

7. The apparatus as set forth in claim 1, wherein the pressure controller computes an average thickness of said PCB, and compares said average thickness against correlated pressure versus thickness data to calculate said clamp pressure.

8. The apparatus as set forth in claim 1, wherein said pressure controller calculates said clamp pressure by determining an error between a thickness allowable range and said measured thickness of said PCB.

9. The apparatus as set forth in claim 1, further comprising:
  a library in which a plurality of printed circuit boards (PCBs) are housed;
  an aligner configured to align the PCBs before transporting said PCBs to the mold dies; and
  a loader configured to transport the PCBs to the aligner from the library.

10. The apparatus as set forth in claim 9, wherein the thickness measurer scans the thickness of the PCBs transported from the loader.

11. A method for fabricating semiconductor packages, comprising:
  moving a printed circuit board (PCB) into mold dies which are configured to clamp the PCB:
  scanning the PCB by moving the PCB past a thickness measurer into the mold dies, in order to measure a thickness of the PCB;
  calculating a clamp pressure corresponding to the measured thickness; and
  clamping mold dies to the PCB using the calculated clamp pressure.

12. The method as set forth in claim 11, wherein the thickness measurer is an optical measuring device.

13. The method as set forth in claim 11, wherein the thickness measurer is a mechanical measuring device.

14. The method as set forth in claim 13, wherein the mechanical measuring device comprises:
  a vertically shifting pin responsive to the morphology of a surface of said PCB; and
  a measuring device for measuring an elevation change associated with said vertically shifting pin.

15. The method as set forth in claim 11, wherein measuring the thickness of a PCB comprises:
  providing a vertically shifting pin that contacts the surface of the PCB, and measuring an elevation change associated with said pin in order to measure the thickness of the PCB.

16. The method as set forth in claim 11, wherein calculating the clamp pressure comprises:
  providing a reference clamp pressure;
  providing correlated data relating to clamp pressure as a function of thickness of a printed circuit board (PCB);
  measuring an average thickness of the PCB; and
  calculating a new clamp pressure by comparing said average thickness to said correlated data.

17. The method as set forth in claim 11, wherein calculating the clamp pressure comprises:
  providing a thickness allowable range and a reference clamp pressure of a PCB;
  comparing the measured thickness of the PCB to said thickness allowable range;
  calculating an error based on the difference between said measured thickness and said thickness allowable range; and
  changing the clamp pressure based on said error.

* * * * *